United States Patent [19]

Schmeckenbecher

[11] 4,206,254
[45] Jun. 3, 1980

[54] METHOD OF SELECTIVELY DEPOSITING METAL ON A CERAMIC SUBSTRATE WITH A METALLURGY PATTERN

[75] Inventor: Arnold F. Schmeckenbecher, Poughkeepsie, N.Y.

[73] Assignee: International Business Machines Corporation, Armonk, N.Y.

[21] Appl. No.: 16,033

[22] Filed: Feb. 28, 1979

[51] Int. Cl.² .......................... B05D 5/12; B05D 1/32
[52] U.S. Cl. .................................. 427/259; 427/96; 427/98; 427/99; 427/264
[58] Field of Search ...................... 427/259, 96, 99, 98, 427/264; 204/192 R

[56] References Cited

U.S. PATENT DOCUMENTS

| | | | |
|---|---|---|---|
| 3,617,373 | 11/1971 | Mott | 427/259 X |
| 3,948,706 | 4/1976 | Schmeckenbecher | 427/259 X |
| 4,008,115 | 2/1977 | Fairbanks et al. | 427/259 X |

Primary Examiner—Evan K. Lawrence
Attorney, Agent, or Firm—Wolmar J. Stoffel

[57] ABSTRACT

A liftoff process for selectively depositing additional metal layers on an existing metallurgy pattern supported on a dielectric substrate which includes the steps of (1) depositing a melt material on the dielectric substrate which material, after melting, has the characteristic of wetting the substrate surface, but not the existing metallurgy pattern, (2) heating the melt material to convert it to a liquid wherein the material is distributed to cover the dielectric substrate surface, but not the metallurgy pattern, (3) cooling the liquid material to solidify it, (4) depositing a blanket layer of metal over the solidified material and the metallurgy pattern, and (5) dissolving the solidified material in a suitable solvent thereby removing the material and the overlying metal layer portions.

3 Claims, 5 Drawing Figures

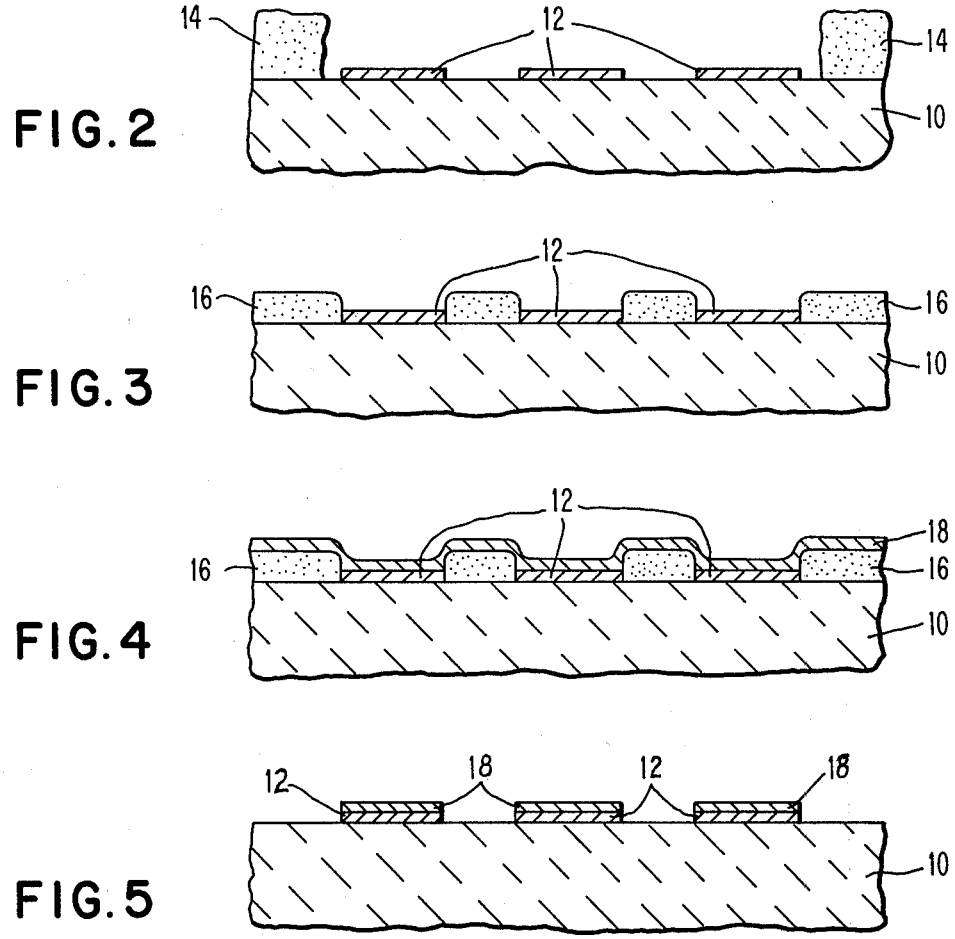

METHOD OF SELECTIVELY DEPOSITING METAL ON A CERAMIC SUBSTRATE WITH A METALLURGY PATTERN

BACKGROUND OF THE INVENTION

1. Technical Field

This invention relates to selective deposition, more particularly to a method of selectively depositing a metal layer on an existing metallurgy pattern, utilizing liftoff techniques.

2. Background Art

The multi-layer ceramic (MLC) technology for producing substrates for integrated circuit semiconductor package assemblies is relatively well known. Such substrates are produced by preparing a slurry of a suitable particulate ceramic, a resin binder material, a solvent for the resin binder, and generally a plasticizing agent, doctor blading the slurry on a base and subsequently drying to form thin flexible sheets, commonly termed ceramic green sheets. These sheets are punched to form via holes, and the via holes filled with a conductive paste and also formed into lines which will ultimately form the internal circuitry. The punched and printed green sheets are assembled into a laminated substrate often consisting of from 15 to 30 sheets and the unit sintered. The resultant substrate is capable of mounting many devices which are interconnected by the internal circuitry. External contact is made by plurality of I/O pins on the opposite side. It is desirable that the multi-layer ceramic substrate be formed with the lines and via holes conforming to very small dimensions. Such microminiaturization is desirable in order that the package be compatible with the integrated circuit device chips mounted thereon. The substrate must be provided on the top surface with many very small pads which are capable of making electrical contact with the corresponding, closely spaced device terminals. In order to more efficiently use the modern integrated circuit technology, as many as possible integrated circuit devices are supported on and interconnected within the same substrate. This arrangement keeps the distance between interconnected devices small and thereby minimizes the time it takes for electrical signals to travel from interrelated devices. Further this reduces the number of electrical connections which must be made and thereby reduces the cost of the package and increases the reliability. The end result is a highly complex multi-layer ceramic package with a lot of small internal printed circuitry contained in a relatively large substrate capable of mounting large numbers of integrated circuit devices.

Such multi-layer ceramic substrates require a relatively complex metallurgy on the topside to make connections to the integrated circuit devices and provide engineering change pads, and on the bottom to make connection to the I/O pads or other type connections. When green ceramic is sintered, there is normally a 17 to 20 percent shrinkage. Frequently, the shrinkage is not uniform throughout the substrate. Since the substrate is relatively large, and the metallurgy geometry quite small, it is difficult and frequently impossible to produce a mask that is 17 to 20 percent smaller than the original substrate that will have all areas that coincide with the metallurgy placed on the substrate before sintering. Such a mask is necessary for depositing additional metallurgy layers using conventional masking techniques. Usually the original metallurgy on the substrate is deposited prior to sintering and consists of a refractory metal paste screened on the surfaces. After sintering the refractory metal must be covered with different metals, as for example, nickel, chromium, gold, etc., in order to conveniently make connections, as by solder, etc. to S.C. devices, and also to thermocompression bonded wires, and I/O pins. Frequently, these screened refractory metal layers can be covered with thin metallurgy layers by electroless plating techniques which does not require a mask. However, such coatings are usually thin and may contain impurities such as phosphorous which may be objectionable in subsequent joining operations. Metal layers can be deposited by electroplating techniques. However, an electrical connection is necessary to each area to be plated. These connections are not always available since pads to be covered can be "floating". Thus there is a need for a technique for applying relatively thick layers of metal over existing metallurgies supported on dielectric substrates, particularly sintered ceramic substrates, which does not require the formation of a mask and the usual alignment to the metallurgy pattern on the substrate.

SUMMARY OF THE INVENTION

The object of this invention is to provide a method of selectively depositing a layer of material on an existing material pattern supported on a dielectric substrate.

Another object of this invention is to provide an improved liftoff process for selectively depositing additional metal layers on an existing metallurgy pattern supported on a dielectric surface.

Yet another object of this invention is to provide a process for selectively depositing metal layers over an existing metallurgy pattern which does not require a mask.

Another object of this invention is to provide a method for selectively depositing a metal layer over an existing metallurgy pattern on a sintered ceramic substrate which could be distorted during sintering precluding the deposition by conventional masking technology.

Another object of this invention is to provide a simple yet inexpensive process for selectively depositing material over an existing pattern, which process is inexpensive and dependable.

The present invention is a lift-off process for selectively depositing a metal layer over an existing metallurgy pattern supported on a dielectric substrate comprising the steps of (1) depositing a meltable material on the dielectric substrate which material, after melting, wets the substrate surface, but not the existing metallurgy pattern; (2) melting the material to redistribute the material over the substrate to cover the dielectric substrate surface, but not the metallurgy pattern; (3) causing the material to solidify to thereby form a masking layer over the substrate surface but not over the existing metallurgy pattern; (4) depositing a blanket layer of metal over the masking layer and the metallurgy pattern; and (5) dissolving the masking layer, resulting in removal of the masking layer and the overlying areas of the blanket metal layer.

BRIEF DESCRIPTION OF DRAWINGS

In the accompanying drawings forming a material part of the disclosure

FIGS. 2 through 5 is a sequence of elevational views in the broken section which depict the structure of a representative substrate at various stages of practice of the invention.

DESCRIPTION OF THE PREFERRED EMBODIMENTS

Figure 1:
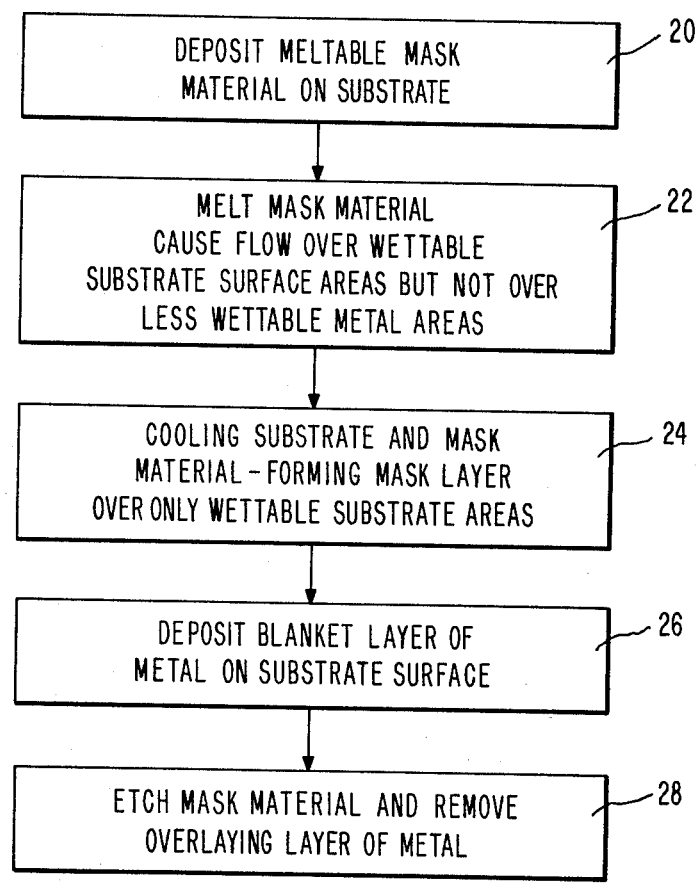
FIG. 1 is a flow chart which summarizes the sequence of process steps of the method of the invention.

For further comprehension of the invention, and of the objects and advantages thereof, reference will be had to the following description and accompanying drawings, and to the appendant claims in which the various novel featues of the invention are more particularly set forth.

Referring now to FIG. 2 there is depicted a fired ceramic substrate 10, typically a multi-layer ceramic substrate which can be produced by the method described in detail in U.S. Pat. No. 3,518,756. Although FIGS. 2-5 are illustrated in broken section, the internal metallurgy in substrate is not illustrated since it does not constitute part of the invention. It is to be understood, however, that substrate 10 need not be a multilayer ceramic substrate, but could be solid with the metallurgy layers formed entirely on the surface. The material of substrate 10 is normally formed of alumina, or alumina plus other materials, or a ceramic glass material which can be fired at a lower temperature such as described in U.S. Pat. No. 3,540,894. On the surface of substrate 10 there is depicted metallurgy areas 12 which are normally formed of a refractory metal which was deposited prior to the sintering of substrate 10. If desired, the metallurgy layers 12 can be provided with a surface layer of metal (not illustrated) deposited by electroless plating technique as described in IBM TDB Vol. 19, No. 3, Aug. 1976, P. 929.

The first process step is depositing a meltable mask material 14 as disclosed in step 20 in FIG. 1. The meltable mask material 14 can be deposited on the surface of substrate 10 by any suitable technique, as for example dispensing on the surface in small spaced quantities, or screened on roughly as a paste over the ceramic sections of the surface, or melting and flowing the material on the surface. The material 14 can be deposited anywhere on the top surface of substrate 10 except on metallurgy areas 12. The meltable mask material can be any suitable material which will wet the ceramic substrate surface of substrate 10, having a contact angle in the range at or near 180°, but not spread over the surface of the metallurgy areas 12, having a contact angle in the range of 0° to 120°. The metallurgy areas 12 are less wetable to the meltable material than the exposed areas of the substrate 10. Further, the melting point of the meltable mask material must be below the melting point of the metal of contact areas 12, and must not damage the surface of either the ceramic substrate 10 or the metallurgy. Further, the meltable material must be readily dissolved in a solvent that will also not damage the substrate or the metallurgy areas. Normally the metallurgy areas 12 serve as contacts to the internal circuitry of the substrate 10, although they could serve as the circuitry between devices and I/O's on the surface of the substrate. A preferred material is LiCl-KCl eutectic mixture consisting of 41.5 mole percent KCl which has a melting point of approximately 350° C. A eutectic mixture is preferred because the melting point is lower than non-eutectic mixtures. However, non-eutectic mixtures of LiCl-KCl can be used provided the melting point is not too high so as to damage the substrate or pad metallurgy. Any other suitable meltable material having the aforedescribed characteristics can be used.

As illustrated in FIG. 3, the substrate with the meltable material 14 deposited thereon is heated to a temperature sufficient to melt the material. When the mask material is melted as disclosed in step 22 of FIG. 1, the material 14 will be redistributed over the surface of ceramic substrate 10 where it will cover the ceramic areas of the substrates which are wettable thereby forming layer 16, leaving the unwettable metal areas of pads 12 exposed. When the substrate 10 is cooled below the melting point of the mask material, as indicated in Step 24 of FIG. 1, the material will solidify. The solidified layer 16 can then be used as a masking layer. The redistribution of the meltable material is thus accomplished without the use of masks which under conventional mask usage would be difficult if not impossible in view of the difficulty of matching a mask with a substrate that has the propensity of shrinking unevenly. The thickness of the mask layer can be any suitable pad thickness. Preferably it is thicker than the thickness of the pad areas 12. Most preferably the thickness of the hardenable layer exceeds the pad thickness by at least 2 microns. The thickness of layer 16 is determined by the amount of meltable material 14 placed on substrate 12, taking into account the wettable area to be covered.

As illustrated in FIG. 4, a layer of metal 18 is then deposited on the surface of the metallurgy pattern 12 and the masking layer 16 which is also indicated in FIG. 1 by Step 26. The layer of metal 18 can be deposited by any suitable technique including vapor deposition, sputter deposition, and the like. The thickness of layer 18 can be any suitable thickness, but is preferably not more than the difference in thickness between masking layer 16 and pads 12. In general the thickness of layer 16 is preferably adjusted to be approximately 2 microns thicker than the thickness of pads 12. The metal of layer 18 can be any suitable metal as for example, nickel, gold, chromium, lead, lead/tin mixtures, and the like.

As indicated in FIG. 1, by Step 28, the masking layer areas 16 are dissolved in a suitable solvent and removed from the substrate 10 as illustrated in FIG. 5. The metal in layer 18 which overlies areas 16 is also removed as indicated in FIG. 5.

If desired, additional metallurgy layers can be deposited on substrate 10 by repeating the aforedescribed process, or if the layers of metal to be deposited are not too thick, multiple layers can be deposited in the step indicated as 26 on FIG. 1 to form a layered structure overpads 12.

The following examples are preferred specific embodiments of the method of the invention and should not be taken to unduly restrict the scope of protection of the invention as set forth in the claims.

EXAMPLE I

A multi-layer ceramic substrate was fabricated utilizing an alumina ceramic material. The substrate was provided with a top pad configuration and a bottom I/O pad configuration formed of a molybdenum conductive material. The molybdenum pads on the top and bottom surfaces were formed by screen printing a molybdenum and organic vehicle paste mixture on the surface of the green ceramic substrate prior to sintering. Upon sintering, the vehicle in the paste was burned off along with the binder resin in the substrate. The thickness of the molybdenum pads was approximately 5 microns measured from the top surface of the substrate.

The sintered substrate was first exposed to a vapor blast of carborundum powder, subsequently dipped for 45 seconds in an acqueous solution consisting of 215 grams per liter of $K_2Fe(CN)_6$ and 75 grams per liter of KOH. The substrate was then dipped for 12 minutes into a boiling acqueous KOH solution having a concentration of 100 grams of KOH per liter. Following this dip the substrate was dipped into an acqueous 10% HCL solution for 10 seconds. The foregoing steps were required to completely clean the surface of the substrate and the metal areas. A LiCl-KCl eutectic mixture was prepared having a 41.5 mole percent LiCl and the balance, i.e. 58.50 mole percent, KCl. The LiCl-KCl powder was sprinkled on the ceramic particulate of the surface of the clean MLC substrate and the substrate heated in forming gas at a temperature of 600° C. until the material melted and spread over the surface. The heating took approximately one-half hour. The resultant average thickness of the LiCl-KCl layer was 10 microns. A blanket layer of gold having a thickness of one micron was vapor deposited on the masked surface of the substrate and the substrate subsequently washed in tap water which resulted in the removal of the Li-KCl layer and the overlying gold layer portions. An examination of the substrate indicated that a uniform gold layer was deposited over only the molydbenum pad areas of the substrate.

EXAMPLE II

The same MLC substrate described in Example I was immersed in an electroless nickel plating bath which resulted in a layer of nickel with a thickness of three microns being deposited only on the surface of the pads. The substrate was then heated at 680° C. to diffuse the nickel into the underlying molybdenum pads. After the substrate was cleaned, a layer of Li-KCl was placed on substrate, melted and cooled as described previously, and a layer of 95% lead and 5% tin evaporated on the surface to a thickness of 3 microns. The Li-KCl layer was again dissolved in water and removed along with the overlying lead/tin areas. This process resulted in a pad configuration having a layer of lead/tin of approximatey 3 microns in thickness which was suitable for solder bonding semiconductor devices to the substrate.

EXAMPLE III

An MLC substrate was prepared and sintered as described in Example I.

The module was dipped in a saturated solution of NaF.HF in water for 10 min. at room temperature, rinsed in deionized water and dried in a stream of dry nitrogen.

A thick slurry was made out of a mixture of equal parts by weight of lithium chloride and potassium chloride and a small amount of water. The slurry was transferred to ceramic areas between the molybdenum pads by screen printing. The module was slowly heated in forming gas to about 600° C., to first allow the water to evaporate, then to melt the LiCl-KCl mixture, and to allow the melt to spread over the whole exposed ceramic surface between the molybdenum pads.

After cooling the module was stored for 2 hours in ambient air. Since the lithium chloride is hygroscopic, moisture from the air was attracted forming a solution of the salts in water. The module then was placed in a desiccator with sulfuric acid as a drying agent. The water was removed from the LiCL-KCl solution, leaving a more uniform layer of the salts on the ceramic surface.

A blanket of gold was evaporated onto the module and lifted off from the ceramic area between the molybdenum pads as described in Example I.

I claim:

1. A lift-off process for selectively depositing a metal layer over an existing metallurgy pattern supported on a dielectric substrate comprising:

depositing a meltable material on the dielectric substrate which material, after melting, will wet the substrate surface but not the existing metallurgy pattern;

melting the material to redistribute the material over the substrate to cover the dielectric substrate wettable areas, leaving the unwettable metallurgy pattern exposed;

causing said material to solidify to thereby form a masking layer over the substrate surface but not over said existing metallurgy pattern;

depositing a blanket layer of said metal over said masking layer and said metallurgy pattern;

dissolving said masking layer resulting in the removal of said masking layer and the overlying areas of said blanket metal layer.

2. The process of claim 1 wherein said substrate is formed of a ceramic material.

3. The process of claim 2 wherein said substrate is a multilayer ceramic substrate.

* * * * *